United States Patent
Zheng et al.

(10) Patent No.: US 6,660,642 B2
(45) Date of Patent: Dec. 9, 2003

(54) TOXIC RESIDUAL GAS REMOVAL BY NON-REACTIVE ION SPUTTERING

(75) Inventors: Zou Zheng, Singapore (SG); Zhou Mei Sheng, Singapore (SG); Yelehanka Ramachandramurthy Pradeep, Singapore (SG); Paul Proctor, Singapore (SG)

(73) Assignee: Chartered Semiconductor Manufacturing Ltd., Sinagpore (SG)

( * ) Notice: Subject to any disclaimer, the term of this patent is extended or adjusted under 35 U.S.C. 154(b) by 188 days.

(21) Appl. No.: 09/912,623

(22) Filed: Jul. 25, 2001

(65) Prior Publication Data

US 2003/0022504 A1 Jan. 30, 2003

(51) Int. Cl.⁷ .................... H01L 21/302; H01L 21/3065
(52) U.S. Cl. .................. 438/700; 438/706; 438/712
(58) Field of Search ................ 438/700, 706, 438/712

(56) References Cited

U.S. PATENT DOCUMENTS

| | | | |
|---|---|---|---|
| 4,784,720 A | * 11/1988 | Douglas | 21/306 |
| 4,931,409 A | 6/1990 | Nakajima et al. | 437/63 |
| 5,514,247 A | 5/1996 | Shan et al. | 156/643.1 |
| 5,654,233 A | * 8/1997 | Yu | 428/643 |
| 5,759,921 A | 6/1998 | Rostoker | 438/711 |
| 5,776,817 A | 7/1998 | Liang | 438/427 |
| 5,846,884 A | 12/1998 | Naeem et al. | 438/714 |
| 5,882,489 A | * 3/1999 | Bersin et al. | 204/192.35 |
| 6,071,822 A | 6/2000 | Donohue et al. | 438/712 |
| 6,091,117 A | * 7/2000 | Shiozawa et al. | 257/384 |
| 6,177,331 B1 | 1/2001 | Koga | 438/424 |
| 6,177,347 B1 | 1/2001 | Liu et al. | 438/675 |

* cited by examiner

*Primary Examiner*—Nadine G. Norton
*Assistant Examiner*—Lynette T. Umez-Eronini
(74) *Attorney, Agent, or Firm*—George O. Saile; Rosemary L. S. Pike

(57) ABSTRACT

A novel method to remove residual toxic gases trapped by a polymerizing process by an inert ion sputter is described. A masking layer is formed overlying a semiconductor substrate. An opening is etched through the masking layer into the semiconductor substrate whereby a polymer forms on sidewalls of the opening and whereby residual toxic gas reactants from gases used in the etching step are adsorbed by the polymer. Thereafter, the polymer is sputtered with non-reactive ions whereby the residual toxic gas reactants are desorbed from the polymer to complete removal of residual toxic gas reactants in the fabrication of an integrated circuit device.

24 Claims, 1 Drawing Sheet

TOXIC RESIDUAL GAS REMOVAL BY NON-REACTIVE ION SPUTTERING

BACKGROUND OF THE INVENTION

(1) Field of the Invention

The invention relates to a method of toxic gas removal in the fabrication of integrated circuits, and more particularly, to a method removing residual toxic gas in a sidewall polymer by non-reactive ion sputtering in the manufacture of integrated circuits.

(2) Description of the Prior Art

As device geometry shrinks, the total sidewall area on the wafer becomes larger and larger. That means that more and more polymer etch byproducts may accumulate on the sidewalls of semiconductor device features. This may cause a safety issue in some polymerizing processes, for example silicon shallow trench etching. Some of the toxic gas species used in the etching process may be trapped or adsorbed in the processing-induced polymer and then released into the atmosphere at a later point in fabrication thereby raising safety issues. The conventional practice is to leave the wafer in the chamber for a much longer period of time following etching to pump away the toxic residual gas reactant/species. However, this extra chamber time sacrifices throughput.

U.S. Pat. No. 6,177,331 to Koga teaches a reactive ion etch physical sputtering process using Argon to etch away corner portions of the hard mask. U.S. Pat. No. 6,177,347 to Liu et al shows an Ar sputter method of removing a polymer within an opening. U.S. Pat. No. 4,931,409 to Nakajima et al removes a polymer using a $NH_4F$ aqueous solution. U.S. Pat. No. 5,514,247 to Shan et al removes metal flakes trapped in a polymer by adding a metal scavenging, halogen-bearing gas to the via etch process. U.S. Pat. No. 5,776,817 to Liang discloses a plasma etch and physical vapor deposition step. U.S. Pat. No. 5,846,884 to Naeem et al uses an RIE having a high-sputter component to reduce polymer buildup. U.S. Pat. No. 6,071,822 to Donohue et al removes a polymer using a fluorinated gas and an inert gas such as Ar. U.S. Pat. No. 5,759,921 to Rostoker shows a plasma etching process.

SUMMARY OF THE INVENTION

A principal object of the present invention is to provide an effective and very manufacturable method of removing residual toxic gases trapped by a polymerizing process after etching in the fabrication of integrated circuit devices.

Another object of the invention is to provide a method to remove residual toxic gases trapped by a polymerizing process by an inert ion sputter.

Yet another object of the invention is to provide a method to remove residual toxic gases trapped by a polymerizing process by an in-situ inert ion sputter.

In accordance with the objects of this invention a new method to remove residual toxic gases trapped by a polymerizing process by an inert ion sputter is achieved. A masking layer is, formed overlying a semiconductor substrate. An opening is etched through the masking layer into the semiconductor substrate whereby a polymer forms on sidewalls of the opening and whereby residual toxic gas reactants from gases used in the etching step are adsorbed by the polymer. Thereafter, the polymer is sputtered with non-reactive ions whereby the residual toxic gas reactants are desorbed from the polymer to complete removal of residual toxic gas reactants in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
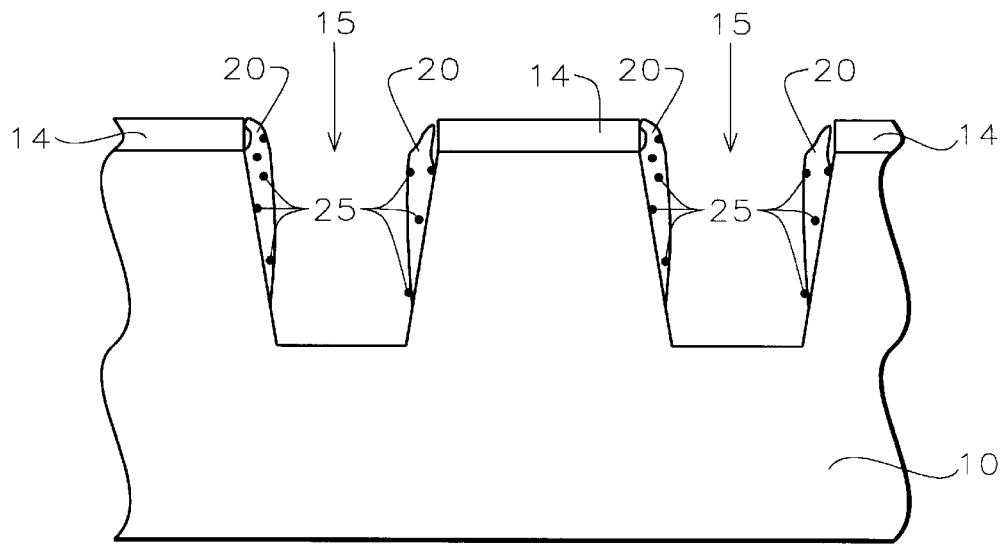
FIGS. 1 and 2 schematically illustrate in cross-sectional representation a preferred embodiment of the present invention.
Figure 2:
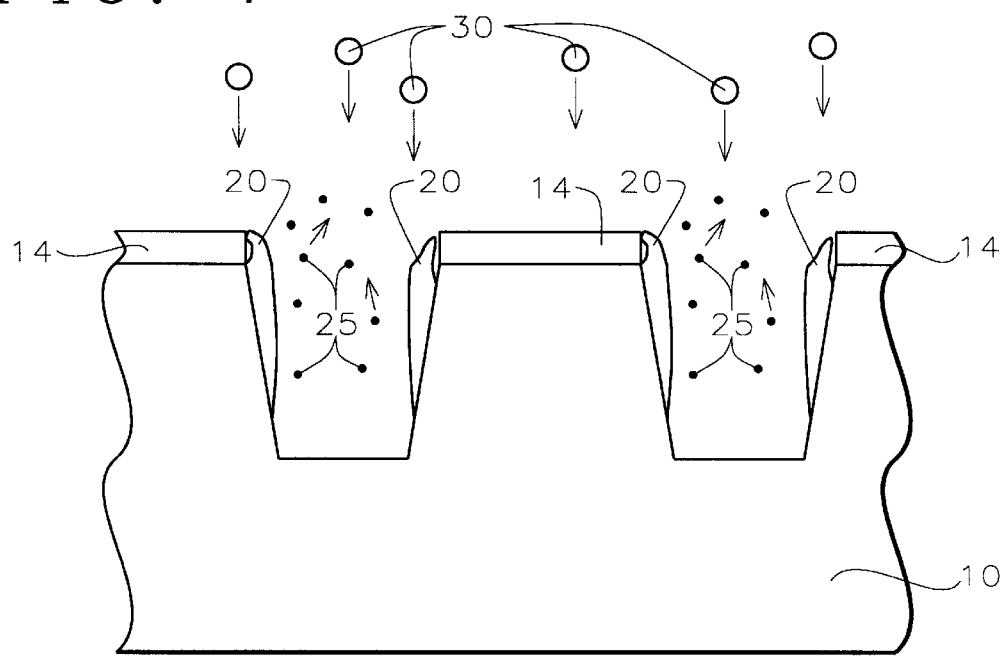

The present invention provides a method to remove residual toxic gases trapped by a polymerizing process. For example, the process could be a silicon trench etching process, as illustrated in FIGS. 1 and 2. However, it will be understood by those skilled in the art that the process of the present invention should not be limited to the application illustrated in the figures, but may be applied and extended in any application in which a post-etch polymer is generated and in which toxic gas residue may be trapped within the polymer.

Referring now more particularly to FIG. 1, there is illustrated a portion of a partially completed integrated circuit device. There is shown a semiconductor substrate 10, preferably composed of monocrystalline silicon. A hard mask layer 14 has been formed over the surface of the substrate. In a typical shallow trench isolation process, for example, a pad oxide layer is first thermally grown on the surface of the semiconductor substrate. Then a silicon nitride layer may be deposited over the pad oxide layer. The pad oxide and silicon nitride layers together form the hard mask layer 14. Now, the hard mask layer 14 is patterned to leave openings where trenches are to be formed. Then, the semiconductor substrate is etched into where it is not covered by the hard mask to form the trenches 15, as shown in FIG. 1.

As a side effect of the etching process, a polymer 20 forms on the sidewalls of the trenches. Polymer 20 may comprise silicon and oxygen based species. Molecules or ions 25 of some of the gas species used in the etching process may become trapped or adsorbed in the polymer buildup 20 on the sidewalls of the trenches. Some of these gas species are toxic. The etching gases may include HBr, $Cl_2$, $CF_4$, $C_2F_6$, $O_2$, and He, for example. The toxic gas reactants/species may include HBr, $Br^-$, $Cl_2$, $Cl^+$, $Cl^-$, and $F^-$, for example.

If the toxic gas species 25 are allowed to remain within the polymer, they may be released to the atmosphere at a later time, causing safety issues. After etching, the wafers are normally transferred from the process chamber to the so-called loadlock chamber where $N_2$ is leaked in to raise the pressure from a vacuum condition to atmospheric pressure. Then the wafers are unloaded from the loadlock chamber. The N2 leaking normally takes a few minutes. During this period, the adsorbed gases may gradually desorb from the substrate into the loadlock. When the door of the loadlock is opened, they may diffuse into the environment and trigger the safety alarm system. Because the toxic gas desorption from the substrate may last for a reasonably long time, even after the wafers are unloaded, the toxic gases may still desorb from the wafers into the environment. Therefore, the best solution is to quickly desorb all the adsorbed toxic gases in the process chamber where the gases are pumped away through the dedicated exhaust channel.

In another conventional process, the wafer may be left in the etching chamber for a long period of time while the toxic residual gas reactant/species are pumped away. However, this extra time sacrifices throughput because natural desorption is slow. So, theoretically, pumping may remove gases from the vacuum, but not efficiently enhance the desorption. The process of the present invention provides a method for removing the toxic residual gas without the sacrifice of throughput.

Referring now to FIG. 2, the novel method of the present invention for removing trapped toxic residual reactant/species from the wafer surface is described. Immediately after the etching process is completed, the wafer surface is sputtered with non-reactive ions in the same chamber. The non-reactive ions 30 transfer energy to the superficial layer 20 of the wafer surface thereby enhancing the superficial layer temperature of the wafer to activate desorption of the residual toxic gas species. No physical sputtering away of any part of the wafer is achieved by this ion sputtering process. The ion sputtering is used only to transfer energy to the substrate to enhance residual gas desorption.

As shown in FIG. 2, the residual toxic gas species 25 are desorbed from the polymer layer and leave the wafer surface as shown by the arrows. The released residual toxic gas species can now be evacuated from the chamber in a safe manner by pumping away through a dedicated exhaust pipeline. This alleviates the safety concern at later process steps. In addition, it helps to reduce the chamber memory effect since the ion sputtering may also help desorb the reactive species adsorbed on the chamber wall. Furthermore, no significant impact is introduced to the processing since the ions are non-reactive. This is an in-situ process because it is formed in the same etching chamber immediately following the etching step.

More specifically, the novel toxic residual gas removal process of the present invention comprises sputtering the surface of the wafer with non-reactive ions including $O^+$, $O_2^+$, $N^+$, $N_2^+$, $Ar^+$, $Ne^+$, $Kr^+$, and $X^+$. The ions are flowed at between about 100 and 500 sccm at a pressure of between about 10 and 100 mTorr. A top power of 200 to 800 watts and bottom power of 50 to 100 watts are applied.

A separate wet cleaning step will remove the polymer 20. The residual toxic gas species begins to desorb from the wafer as soon as it is exposed to the atmosphere. Since the wafer is exposed to the atmosphere well before it is moved to the separate wet cleaning step, the toxic gas species must be removed prior to removal of the polymer by the process of the present invention.

Processing then continues as is conventional in the art. For example, the trenches may be filled with an oxide layer to complete shallow trench isolation regions.

The process of the present invention can be used in any etching process where a sidewall polymer is formed. The non-reactive ions sputtered onto the wafer cause the release of the residual toxic gas reactants/species from the sidewall polymer, thus allowing a controlled and safe recovery of these toxic species.

While the invention has been particularly shown and described with reference to the preferred embodiments thereof, it will be understood by those skilled in the art that various changes in form and details may be made without departing from the spirit and scope of the invention.

What is claimed is:

1. A method of removing residual toxic gas reactants from a sidewall polymer in the fabrication of an integrated circuit device comprising:

forming a masking layer overlying a semiconductor substrate;

etching an opening through said masking layer into said semiconductor substrate whereby a polymer forms on sidewalls of said opening and whereby residual toxic gas reactants from gases used in said etching step are adsorbed by said polymer; and thereafter sputtering said polymer with non-reactive ions wherein said sputtering transfers energy to said polymer whereby said residual toxic gas reactants are desorbed from said polymer and wherein said sputtering does not physically remove said polymer or any part of said substrate to complete said removing of said residual toxic gas reactants in the fabrication of said integrated circuit device.

2. The method according to claim 1 wherein said semiconductor substrate comprises silicon and wherein said opening forms a shallow trench isolation trench.

3. The method according to claim 1 wherein said gases used in said etching step are selected from the group consisting of: HBr, $Cl_2$, $CF_4$, $C_2F_6$, $O_2$, and He.

4. The method according to claim 1 wherein said residual toxic gas reactants comprise one or more of the group containing: HBr, $Br^-$, $Cl_2$, $Cl^-$, $Cl^-$, and $F^-$.

5. The method according to claim 1 wherein said polymer comprises silicon and oxygen based species.

6. The method according to claim 1 wherein said non-reactive ions are selected from the group consisting of: $O^-$, $O_2^+$, $N^+$, $N_2^+$, $Ar^+$, $Ne^+$, $Kr^+$, and $Xe^+$.

7. The method according to claim 1 wherein said step of sputtering said polymer with non-reactive ions at 100 to 500 sccm at a pressure of 10 to 100 mTorr, top power of 200 to 800 watts, and bottom power of 50 to 100 watts for about 30 seconds.

8. The method according to claim 1 wherein said step of sputtering said polymer with non-reactive ions also desorbs said residual toxic gas reactants from walls of a chamber in which said etching and said sputtering steps are performed.

9. The method according to claim 1 wherein said sputtering step is performed immediately after said etching step in a single chamber.

10. A method of removing residual toxic gas reactants from a sidewall polymer in the fabrication of an integrated circuit device comprising:

forming a masking layer overlying a semiconductor substrate;

in an etching chamber, etching an opening through said masking layer into said semiconductor substrate whereby a polymer forms on sidewalls of said opening and whereby residual toxic gas reactants from gases used in said etching step are adsorbed by said polymer; and immediately thereafter within same said etching chamber, sputtering said polymer with non-reactive ions wherein said sputtering transfers energy to said polymer whereby said residual toxic gas reactants are desorbed from said polymer and wherein said sputtering does not physically remove said polymer or any part of said substrate to complete said removing of said residual toxic gas reactants in the fabrication of said integrated circuit device.

11. The method according to claim 10 wherein said semiconductor substrate comprises silicon and wherein said opening forms a shallow trench isolation trench.

12. The method according to claim 10 wherein said gases used in said etching step are selected from the group consisting of: HBr, $Cl_2$, $CF_4$, $C_2F_6$, $O_2$, and He.

13. The method according to claim 10 wherein said residual toxic gas reactants comprises one or more of the group containing: HBr, $Br^-$, $Cl_2$, $Cl^+$, $Cl^-$, and $F^-$.

14. The method according to claim 10 wherein said polymer comprises silicon and oxygen based species.

15. The method according to claim 10 wherein said non-reactive ions are selected from the group of: $O^+$, $O_2^+$, $N^+$, $N_2^+$, $Ar^+$, $Ne^+$, $Kr^+$, and $Xe^+$.

16. The method according to claim 10 wherein said step of sputtering said polymer with non-reactive ions at 100 to 500 sccm at a pressure of 10 to 100 mTorr, top power of 200 to 800 watts, and bottom power of 50 to 100 watts for about 30 seconds.

17. The method according to claim 10 wherein said step of sputtering said polymer with non-reactive ions also desorbs said residual toxic gas reactants from walls of a chamber in which said etching and said sputtering steps are performed.

18. A method of removing residual toxic gas reactants from a sidewall polymer in the fabrication of an integrated circuit device comprising:

forming a masking layer overlying a semiconductor substrate;

in an etching chamber, etching an opening through said masking layer into said semiconductor substrate whereby a polymer forms on sidewalls of said opening and whereby residual toxic gas reactants from gases used in said etching step are adsorbed by said polymer; and immediately thereafter within same said etching chamber, sputtering said polymer with non-reactive ions wherein said sputtering transfers energy to said polymer whereby said residual toxic gas reactants are desorbed from said polymer and whereby said residual toxic gas reactants are desorbed from walls of said etching chamber and wherein said sputtering does not physically remove said polymer or any part of said substrate to complete said removing of said residual toxic gas reactants in the fabrication of said integrated circuit device.

19. The method according to claim 18 wherein said semiconductor substrate comprises silicon and wherein said opening forms a shallow trench isolation trench.

20. The method according to claim 18 wherein said gases used in said etching step are selected from the group consisting of: HBr, $Cl_2$, $CF_4$, $C_2F_6$, $O_2$, and He.

21. The method according to claim 18 wherein said residual toxic gas reactants comprises one or more of the group containing: HBr, $Br^-$, $Cl_2$, $Cl^+$, $Cl^-$, and $F^-$.

22. The method according to claim 18 wherein said polymer comprises silicon and oxygen based species.

23. The method according to claim 18 wherein said non-reactive ions are selected from the group of: $O^+$, $O_2^+$, $N^+$, $N_2^+$, $Ar^+$, $Ne^+$, $Kr^+$, and $Xe^+$.

24. The method according to claim 18 wherein said step of sputtering said polymer with non-reactive ions at 100 to 500 sccm at a pressure of 10 to 100 mTorr, top power of 200 to 800 watts, and bottom power of 50 to 100 watts for about 30 seconds.

* * * * *